United States Patent [19]

Miyazaki et al.

[11] Patent Number: 4,635,373

[45] Date of Patent: Jan. 13, 1987

[54] WAFER CONVEYING APPARATUS WITH ALIGNMENT MECHANISM

[75] Inventors: Makoto Miyazaki; Minoru Yomoda, both of Kawasaki; Takehiko Suzuki, Yokohama, all of Japan

[73] Assignee: Canon Kabushiki Kaisha, Tokyo, Japan

[21] Appl. No.: 772,460

[22] Filed: Sep. 4, 1985

[30] Foreign Application Priority Data

Sep. 7, 1984 [JP] Japan ................................ 59-186466
Sep. 7, 1984 [JP] Japan ................................ 59-186468

[51] Int. Cl.⁴ .......................... G01B 5/25; G01B 11/27
[52] U.S. Cl. .................... 33/180 R; 33/184.5; 33/533; 33/573
[58] Field of Search ............ 33/180 R, 181 R, 180 L, 33/184.5, 286, 533, 568, 573

[56] References Cited

U.S. PATENT DOCUMENTS

| | | | |
|---|---|---|---|
| 3,589,079 | 6/1971 | Beasley | 33/180 R |
| 4,005,651 | 2/1977 | Sigel et al. | 33/184.5 |
| 4,414,749 | 11/1983 | Johannsmeier | 33/184.5 |
| 4,563,824 | 1/1986 | Baun | 33/180 R |

Primary Examiner—Willis Little
Attorney, Agent, or Firm—Fitzpatrick, Cella, Harper & Scinto

[57] ABSTRACT

A wafer pre-alignment apparatus including a mechanical pre-alignment device for positioning a wafer on the basis of an outer periphery configuration of the wafer, an image processing pre-alignment device for positioning the wafer on the basis of a pattern of an image formed on the wafer the image processing aligner being effective to perform the pre-alignment operation with a higher accuracy than the mechanical aligner, and a selector for operating the apparatus selectively in a first mode wherein the mechanical aligner only is operated for the wafer and in a second mode wherein the image processing aligner only is operated for the wafer, or the mechanical aligner and the image processing aligner are operated sequentially for the wafer.

8 Claims, 5 Drawing Figures

WAFER CONVEYING APPARATUS WITH ALIGNMENT MECHANISM

FIELD OF THE INVENTION AND RELATED ART

The present invention relates to a wafer conveying apparatus with alignment mechanism, more particularly to a wafer conveying apparatus having a function of a wafer pre-alignment.

The wafer pre-alignment operation is effected prior to a fine or final alignment between a mask and a wafer is order to increase the speed and accuracy of the fine alignment. Conventionally, the wafer pre-alignment relies on a mechanical or physical alignment on the basis of the configuration of the periphery of the wafer, as shown in FIG. 2, wherein the mechanical alignment or positioning device includes a driving roller 11, an idler 12, a motor shaft 13, a freely rotatable roller 14 and an urging arm 15. A mechanical positioning device of this type involves the drawback that the accuracy in the positioning is adversely affected by unavoidable variations in the outer periphery configuration of the wafer 1 and the thickness of the resist deposited on the edge of the wafer or deposited on the rollers 11 and/or 15.

Therefore, a mask aligner provided only with a mechanical type positioning device as a wafer pre-alignment device, involves the inconvenience that the accuracy of the wafer pre-alignment is not sufficient in the process steps subsequent to the (first) mask-wafer alignment.

SUMMARY OF THE INVENTION

Accordingly, it is a principal object of the present invention to provide a wafer conveying apparatus with an alignment mechanism, which is capable of achieving a satisfactorily high accuracy of wafer pre-alignment, thus providing a solution to the above described drawbacks involved in the conventional apparatus.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
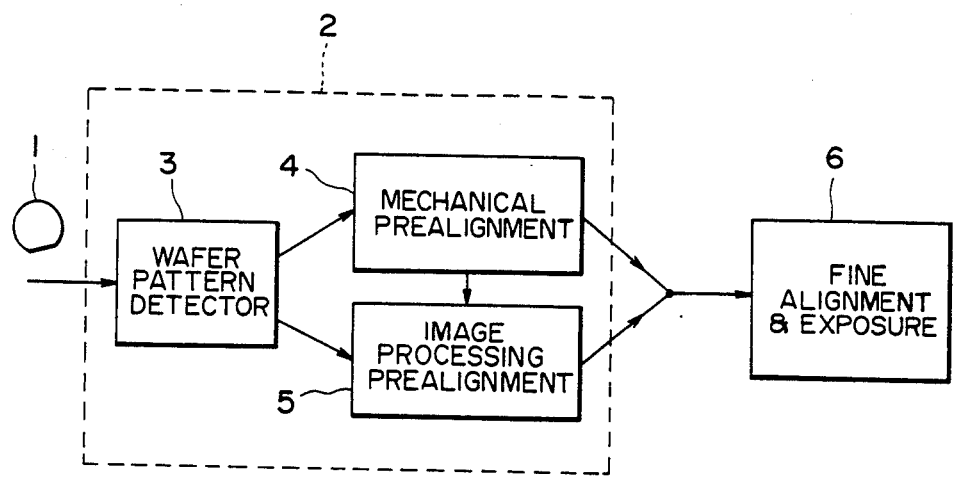
FIG. 1 is a schematic diagram of a wafer conveying apparatus with alignment mechanism according to a first embodiment of the present invention.
Figure 2:
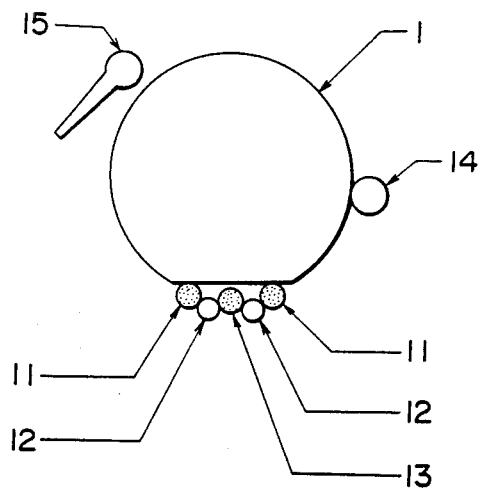
FIG. 2 illustrates a mechanical pre-alignment on the basis of an outer periphery configuration of a wafer.

Referring now to FIG. 1, there is shown a wafer conveying apparatus with alignment mechanism according to a first embodiment of the present invention, wherein a wafer is depicted by a reference numeral 1, and a wafer pre-alignment apparatus incorporating the feature of the present invention is designated by a reference numeral 2. The wafer pre-alignment apparatus comprises a discriminating device 3 which serves to discriminate whether the wafer 1 already has an image of a pattern or not, a mechanical pre-alignment device having a construction similar to that shown in FIG. 2 and an image processing type pre-alignment device 5. The wafer pre-alignment apparatus 2 is operatively associated with a fine alignment and exposure apparatus 6 which may be of a conventional type.

The discriminating device 3 senses the absence or presence of the pattern image on the wafer by, for example, detecting a reflection factor of the wafer. In operation, the wafer 1 is supplied to the discriminating device 3, where the discrimination is made as to whether or not the wafer 1 has a pattern image. If the result of the discrimination is affirmative, that is, the wafer 1 has already an image of a pattern, the wafer 1 is fed to the image processing type pre-alignment device 5 where the wafer is pre-aligned or positioned correctly on the basis of a pattern image processing operation.

If, however, the result of the discrimination is negative, that is, the wafer 1 does not have any image of a pattern, the wafer 1 is fed to the mechanical type pre-alignment device 4 where the wafer 1 is mechanically pre-aligned relying on the outer periphery configuration of the wafer 1.

After the wafer 1 is subjected to the wafer pre-alignment operation by the wafer pre-alignment device 2 either through the mechanical pre-alignment device 4 or through the image processing pre-alignment device 5, it is supplied to the mask-wafer fine alignment and exposure apparatus 6 where the wafer 1 is finely aligned with a mask and the wafer 1 is exposed to the pattern of the mask.

In this embodiment, the wafer 1 is directly supplied to the image processing pre-alignment device 5 when the discriminating device 3 discriminates the presence of the pattern image. However, this embodiment may be modified such that when the discriminating device 3 senses the presence of the pattern image, the wafer 1 is first fed to the mechanical pre-alignment device 4 where the wafer 1 is mechanically pre-aligned, and then the wafer 1 is supplied to the image processing pre-alignment device 5 where the wafer 1 is further pre-aligned with a higher precision. This modification is effective to save the time required for the image processing pre-alignment device 5 to accomplish the pre-alignment.

Another modification is possible wherein the wafer 1 is first supplied to the mechanical pre-alignment device 4 where the wafer 1 is mechanically pre-aligned; the wafer 1 is fed to the discriminating device 3 where the discrimination is made as to whether or not the wafer 1 has a pattern image; upon the presence of the pattern image discriminated, the wafer 1 is fed to the image processing pre-alignment device 5 where the wafer 1 is pre-aligned; upon the absence of the pattern image, on the other hand, the image processing pre-alignment device 5 is skipped. In this modification, the time required for pre-alignment using the image processing pre-alignment device 5 can be saved similarly to the foregoing modification, and also, the discrimination of the presence or absence of the wafer pattern can be performed by the image processing pre-alignment device 5.

In the foregoing embodiment and modifications, the mechanical pre-alignment and the image processing pre-alignment are carried out at different positions. However, those operations may be performed at the same position so as to reduce the size of the overall apparatus and to increase the speed of pre-alignment. In this case, the apparatus may be simplified by employing an image processing positioning on the basis of the outer periphery configuration of the wafer.

Also, it is possible that the mechanical pre-alignment device 4 and the image processing pre-alignment device 5 are arranged in series wherein the mechanical pre-alignment device 4 is made inoperative upon the absence of the pattern image on the wafer 1 so that the wafer 1 is simply passed through the mechanical pre-alignment device 4. This is advantageous in that the conveying belt system is simplified and minimized.

In the foregoing embodiment, the pre-alignment operation mode is switched on the basis of the presence and absence of the pattern image on the wafer. However, it is a possible alternative that the wafer 1 is provided with an identification number, which the wafer pre-alignment apparatus 2 detects so as to discriminate the accuracy of the pre-alignment required for the particular wafer 1; and the mode is selected on the basis of the required accuracy. Further alternatively, the mode may be changed on the basis of the accuracy manually set on the keyboard or the like.

Figure 3:
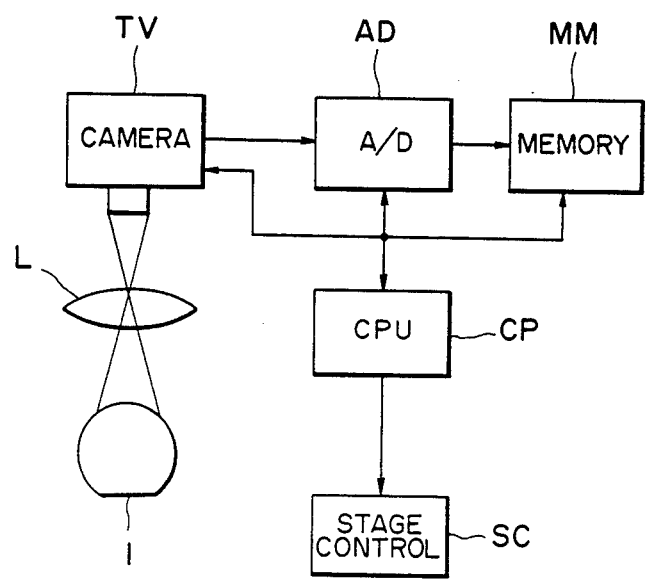
FIG. 3 is a block diagram of an apparatus according to a second embodiment of the present invention.

FIG. 3 is a block diagram of a pre-alignment apparatus according to the second embodiment of the present invention, which may replace the apparatus 4 shown in FIG. 1. The pre-alignment apparatus comprises an objective lens L, a television camera TV, A/D transducer AD, a memory MM in which a digitalized wafer image is stored, and a processor (CPU) CP for controlling the camera TV, the A/D transducer AD, the memory MM and a stage controller SC.

Figures 4, 5:
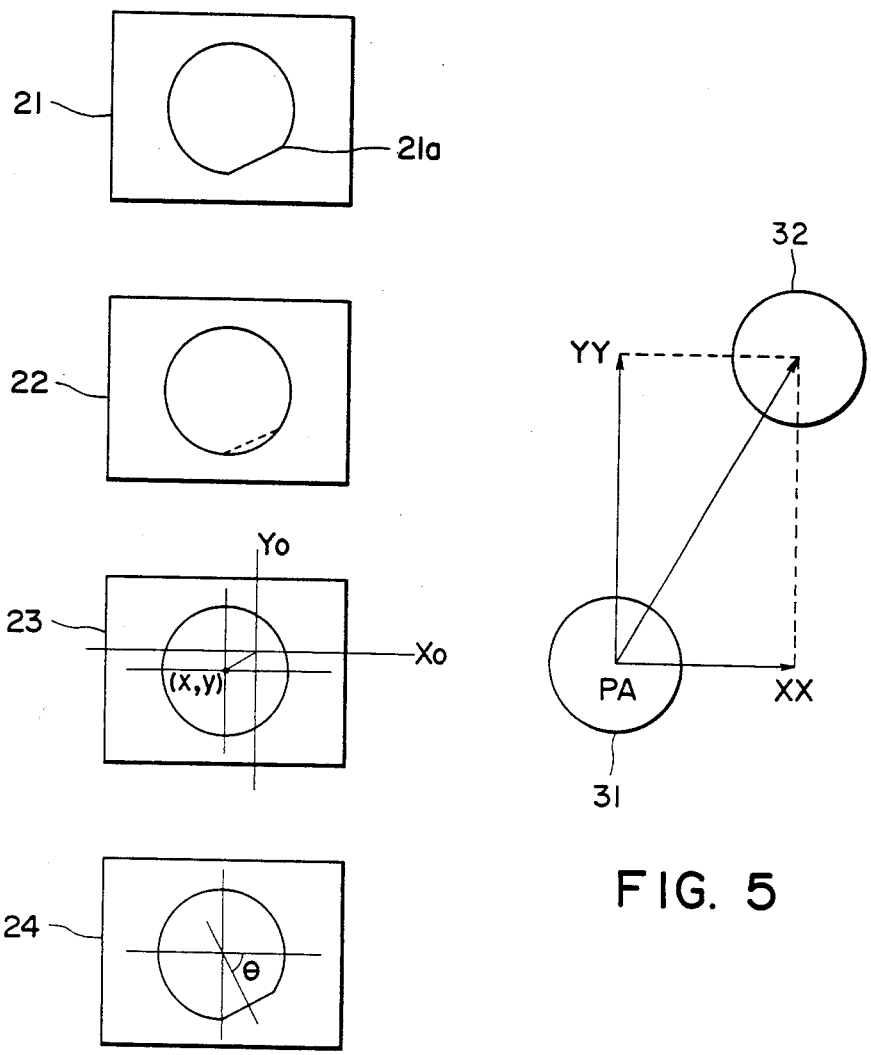
FIG. 4 illustrates process steps of obtaining a displacement in the x-direction, y-direction and $\theta$-direction in the apparatus shown in FIG. 3.
FIG. 5 illustrates the relation between a position where the measurement is effected and a position where a final alignment is performed.

FIG. 4 illustrates the processing steps of positioning the wafer in the pre-alignment apparatus. In this Figure, the reference numeral 21 designates an image of the wafer stored in the memory MM; the numeral 22 designates a theoretical complete circle image corresponding to the wafer without the orientation flat 21a of the image 21. The processing for providing this is effected by treating the image data stored in the memory MM by the processor CP. As indicated by the reference numeral 23, the deviations or displacements of the image 22 are obtained in the x-direction and y-direction. The reference axes $X_0$ and $Y_0$ are the reference axes in the memory MM for defining coordinates, on which the center of the wafer 1 has the coordinate position (x, y). On the basis of the coordinate position, the deviation of the wafer is determined both in the x-direction and y-direction. Then, as indicated by the reference numeral 24, the image 23 and the image 21 are combined so that the angular position of the orientation flat 21a is determined. Through those processing steps described above, the deviations defined by x, y and $\theta$ are determined, which are stored in the memory MM.

The stage control circuit SC moves the wafer 1 so as to remove the deviation determined in the manner described above.

In FIG. 5, there is shown a manner in which the wafer is moved from a position 31 where the wafer is pre-aligned to a position 32 where the wafer is subjected to a final alignment. The wafer is moved from the position 31 to the position 32 by the amount XX, YY as indicated in FIG. 5. In this movement, the stage control SC receives the deviation defined by x, y and $\theta$ determined in the manner described above, and that the wafer is actually moved by the amount (XX+x) in the x-direction, (YY+y) in the y-direction and $\theta$ in the $\theta$-direction. The movement in the $\theta$ direction is a rotational movement to compensate the rotational deviation. Those operations are controlled and automatically performed under the control of the processor, whereby the wafer is pre-aligned correctly at all times.

In the foregoing example, the measurement of the deviation is performed at the position 31 and the measured deviation is eliminated in the x-direction, y-direction and $\theta$-direction in the process of moving the wafer to the position 32. However, it is possible that the wafer is moved in the x-direction, y-direction and $\theta$-direction at the position 31 to eliminate the deviation. Also, in the foregoing example, a TV camera is used to determine the wafer position, but it is a possible alternative to use another means such as a laser scanning type device for determining the position of the wafer.

As described above, according to the present invention, it is made possible that the location of the wafer is determined and the wafer is positioned correctly with high precision and without contact to the wafer. Thus, the present invention can eliminate the positional error involved in the conventional mechanical positioning operation which may be caused by deposition of photoresist or the like. Further, as for the operation with a first mask in which there is no need to carry out the mask-wafer fine alignment after the wafer pre-alignment, the mechanical pre-alignment may be used. As for the operation with a mask subsequent to the first mask wherein the mask-wafer fine alignment is required after the wafer pre-alignment, the image processing pre-alignment may be used to enhance the accuracy in the wafer pre-alignment.

While the invention has been described with reference to the structures disclosed herein, it is not confined to the details set forth and this application is intended to cover such modifications or changes as may come within the purposes of the improvements or the scope of the following claims.

What is claimed is:

1. A wafer pre-alignment apparatus, comprising:
   first positioning means for positioning a wafer on the basis of an outer periphery configuration of the wafer;
   second positioning means for positioning the wafer on the basis of a pattern of an image formed on the wafer; and
   means for operating said apparatus selectively in a first mode wherein only said first positioning means positions the wafer and in a second mode wherein only said second positioning means positions the wafer, or said first positioning means and said second positioning means sequentially position the wafer.

2. A wafer pre-alignment apparatus according to claim 1, wherein said operating means includes means for discriminating whether or not the wafer has the pattern of the image thereon and is effective to operate said apparatus in the first mode when said discriminating means discriminates the absence of the pattern.

3. A wafer pre-alignment apparatus according to claim 1, wherein said operating means is responsive to an identification number on a wafer or an input to a keyboard, in response to which said operating means discriminates whether or not a high accuracy positioning operation is required, and when it is not required, said operating means selects the first mode.

4. A wafer pre-alignment apparatus according to any one of claims 1-3, wherein said first positioning means and said second positioning means are operated at one end and the same position.

5. A wafer pre-alignment apparatus according to any one of claim 1, wherein said first positioning means mechanically aligning the wafer.

6. A wafer pre-alignment apparatus, comprising:
means for sensing an image of an outer periphery configuration of a wafer carried on a stage;
means for determining a deviation of the wafer from a reference position in accordance with the image of the outer periphery configuration sensed by said sensing means; and
stage control means responsive to said determining means for correctly positioning the wafer.

7. A wafer pre-alignment apparatus according to claim 6, wherein said determining means determines a position of the center of the wafer on the basis of image data of the outer periphery of the wafer without an orientation flat thereof, and determines the deviation on the basis of the determined position of the center.

8. A wafer pre-alignment apparatus according to claim 6 or 7, wherein the deviation is defined by a translational deviation of the center of the wafer from the reference position and an angular deviation of an orientation flat of the wafer from a reference line.

* * * * *